(12) United States Patent
Kim et al.

(10) Patent No.: US 8,158,889 B2
(45) Date of Patent: Apr. 17, 2012

(54) ELECTROMAGNETIC BANDGAP STRUCTURE AND PRINTED CIRCUIT BOARD

(75) Inventors: Han Kim, Yongin-si (KR); Je-Gwang Yoo, Yongin-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 905 days.

(21) Appl. No.: 12/213,571

(22) Filed: Jun. 20, 2008

(65) Prior Publication Data
US 2008/0314630 A1    Dec. 25, 2008

(30) Foreign Application Priority Data

Jun. 22, 2007  (KR) .................. 10-2007-0061829
Jun. 22, 2007  (KR) .................. 10-2007-0061831

(51) Int. Cl.
*H05K 1/11*   (2006.01)
*H01P 3/08*   (2006.01)

(52) U.S. Cl. ......... 174/261; 333/204; 333/185; 333/246

(58) Field of Classification Search .......... 174/250–268; 361/748–803; 333/185, 204, 246
See application file for complete search history.

(56) References Cited

U.S. PATENT DOCUMENTS

2005/0029632 A1   2/2005   McKinzie, III et al.
2007/0090398 A1   4/2007   McKinzie, III

FOREIGN PATENT DOCUMENTS
JP    2006-302986    11/2006

OTHER PUBLICATIONS

Japanese Office Action dated Sep. 21, 2010 in corresponding Japanese Patent Application 2008-162569.

*Primary Examiner* — Zachary M Pape

(57) ABSTRACT

An electromagnetic bandgap structure and a printed circuit board are disclosed. In accordance with an embodiment of the present invention, the electromagnetic bandgap structure includes a mushroom type structure comprising a first metal plate and a via of which one end is connected to the first metal plate; a second metal plate connected to the other end of the via; a first metal layer being connected to the second metal layer through a metal line; a first dielectric layer, layer-built between the first metal layer and the first metal plate; a second dielectric layer, layer-built on the first metal plate and the first dielectric layer; and a second metal layer, layer-built on the second dielectric layer. With the present invention, it is possible to solve the aforementioned mixed signal problem by preventing the EM wave of a certain frequency range from being transferred.

22 Claims, 18 Drawing Sheets

ELECTROMAGNETIC BANDGAP STRUCTURE AND PRINTED CIRCUIT BOARD

CROSS-REFERENCE TO RELATED PATENT APPLICATIONS

This application claims the benefit of Korean Patent Application No. 10-2007-0061829, filed on Jun. 22, 2007, and No. 10-2007-0061831, filed on June 22, 2007 in the Korean Intellectual Property Office, the disclosure of which is incorporated herein in their entirety by reference.

BACKGROUND OF THE INVENTION

1. Field of the Invention

The present invention is related to a printed circuit board, and more particularly to an electromagnetic bandgap structure and a printed circuit board solving a mixed signal problem between an analog circuit and a digital circuit.

2. Background Art

With an increasing importance of mobility, various kinds of devices, including mobile communication terminals, PDAs (Personal Digital Assistants), notebook computers, and DMB (Digital Multimedia Broadcasting) devices, are being introduced in the market.

These kinds of devices include a printed circuit board that consists of an analog circuit, such as an RF circuit, and a digital circuit.

FIG. 1 is a cross-sectional view of a printed circuit board that consists of an analog circuit and a digital circuit.

A printed circuit board 100 includes metal layers 110-1, 110-2, 110-3 and 110-4 (hereinafter collectively referred to as 110), dielectric layers 120 (subdivided into 120-1, 120-2 and 120-3), which is layer-built between the metal layers 110, and a digital circuit 130, which is mounted on the top level metal layer 110-1, and an RF circuit 140.

Supposing that the metal layer represented by reference numeral 110-2 is a ground layer and the metal layer represented by reference numeral 110-3 is a power layer, an electric current flows through a via 160 connected between the ground layer 110-2 and the power layer 110-3, and the printed circuit board 100 serves a predetermined function or operation.

Here, an EM wave 150, caused by an operating frequency and harmonic components of the digital circuit 130, is transferred to the RF circuit 140, causing a mixed signal problem. The mixed signal problem means disturbing an accurate operation of the RF circuit 140 because the EM wave from the digital circuit 130 has a frequency within the operating frequency of the RF circuit 140. For example, when the RF circuit 140 receives a predetermined frequency signal, accurate receipt of the signal may be difficult because the EM wave including the predetermined frequency signal is transferred from the digital circuit 130.

It is becoming harder to solve this mixed signal problem because digital devices become more complex and the operating frequency of the digital circuit becomes higher.

Using a decoupling capacitor, which is a typical solution for the power noise problem, can not be a proper solution in high frequency, and studies for a structure of blocking a high frequency noise between the RF circuit and the digital circuit are needed.

FIG. 2 illustrates the cross section of an electromagnetic bandgap structure solving the mixed signal problem between an analog circuit and a digital circuit in accordance with the related art, and FIG. 3 illustrates a plan view of metal plates arrangement of the electromagnetic bandgap structure shown in FIG. 2. FIG. 4 illustrates a perspective view of the electromagnetic bandgap structure shown in FIG. 2, and FIG. 5. illustrates an equivalent circuit of the electromagnetic bandgap structure shown in FIG. 2.

An electromagnetic bandgap structure 200 includes a first metal layer 210-1, a second metal layer 210-2, a first dielectric layer 220a, a second dielectric layer 220b, a metal plate 232 and a via 234.

The first metal layer 210-1 and the second metal layer (210-2) are connected through the via 234 and the metal plate 232, and the via 234 forms a mushroom type structure 230 (refer to FIG. 4).

In case the first metal layer 210-1 is a ground layer, the second metal layer 210-2 is a power layer, and in case the first metal layer 210-1 is a power layer, the second metal layer 210-2 is a ground layer.

That is, by repetitively arranging the mushroom type structure 230 consisting of the metal plate 232 and the via 234 between the metal layer and power layer (refer to FIG. 3), a bandgap structure, which blocks a signal within a certain frequency range, is formed.

The function that blocks the signal within a certain frequency range is resulted from the resistance (RE, RP), inductance (LE, LP), capacitance (CE, CP, CG), conductance (GP, GE) components and can be represented as an equivalent circuit, as shown in FIG. 5.

A typical digital device in which a digital circuit and an RF circuit are implemented on the same board is the mobile communication terminal, which requires noise blocking between 0.8 and 2.0 GHz, which is the operating frequency range of the RF circuit. Moreover, the size of the mushroom type structure must be small enough to be used in the mobile communication terminal. In case of using the aforementioned electromagnetic bandgap structure, however, the two problems can not be solved at the same time.

As the mushroom type structure becomes smaller, the bandgap frequency in which the noise is blocked becomes higher, the noise blocking is little effective in the 0.8~2.0 GHz range, which is the operating frequency of the RF circuit in the mobile communication terminal.

SUMMARY OF THE INVENTION

Accordingly, the present invention provides an electromagnetic bandgap structure and a printed circuit board that have both a small size and a low bandgap frequency.

The present invention also provides an electromagnetic bandgap structure and a printed circuit board that can solve the mixed signal problem of a digital device such as a mobile communication device, in which an RF circuit and a digital circuit are implemented on the same board.

The present invention also provides an electromagnetic bandgap structure and a printed circuit board that can block a noise of a certain frequency.

An aspect of present invention features an electromagnetic bandgap structure.

The electromagnetic bandgap structure in accordance with an embodiment of the present invention can include: a mushroom type structure having a first metal plate and a via of which one end is connected to the first metal plate; a second metal plate connected to the other end of the via; a first metal layer connected to the second metal layer through a metal line; a first dielectric layer, layer-built between the first metal layer and the first metal; a second dielectric layer, layer-built on the first metal plate and the first dielectric layer; and a second metal layer, layer-built on the second dielectric layer.

Here, the first metal layer and the second metal plate can be placed on a same planar surface, and the metal line can be placed on a same planar surface as the first metal layer and the second metal plate.

Also, the second metal plate can be accommodated in a hole formed on the first metal layer and electrically connected through the metal line, and an inner wall of the hole can be spaced from the second metal plate at a predetermined distance.

There can be a plurality of mushroom type structures between the first metal layer and the second metal layer. Here, the first metal plate of the plurality of mushroom type structures can be placed on a same planar surface. The same number of second metal plates as the number of the mushroom type structures can correspond to an arrangement of the plurality of mushroom type structures and be formed on a same planar surface as the first metal plate.

Also, the metal line can have a spiral structure that is wound around the second metal plate.

Using an inductance that is serially connected between the first metal plate and the second metal plate corresponding to the via, an electromagnetic wave of a certain frequency range can be prevented from being transferred.

Another aspect of present invention features a printed circuit board.

The printed circuit board in accordance with an embodiment of the present invention can include: a mushroom type structure having a first metal plate and a via of which one end is connected to the first metal plate; a second metal plate connected to the other end of the via; a first metal layer being connected to the second metal layer through a metal line; a first dielectric layer, layer-built between the first metal layer and the first metal; a second dielectric layer, layer-built on the first metal plate and the first dielectric layer; and a second metal layer, layer-built on the second dielectric layer. An electromagnetic bandgap structure having the second metal layer is placed between the analog circuit and the digital circuit.

Here, the first metal layer can be one of a ground layer and a power layer, and the second metal layer can be the other of the ground layer and the power layer.

Also, the analog circuit can be an RF circuit having an antenna that receives an RF signal from the outside.

Another aspect of present invention features an electromagnetic bandgap structure.

The electromagnetic bandgap structure in accordance with another embodiment of the present invention can include: a first metal layer; a first dielectric layer, layer-built on the first metal layer; a mushroom type structure having a metal plate built on the first dielectric layer and a via of which one end is connected to the metal plate; a second dielectric layer, layer-built on the metal plate and the first dielectric layer; a second metal layer, layer-built on the second dielectric layer. One end of the via can be placed in a hole formed on the first metal layer and connected to the first metal layer through a metal line.

Here, the other end of the via can be connected to a via land placed in the hole, and the metal line can connect the via land and the first metal layer.

The hole can accommodate the via and the metal line.

Also, there can be a plurality of mushroom type structures between the first metal layer and the second metal layer.

Also, the metal line can be a straight line shape that connects the other end of the via and the first metal layer or a spiral structure.

Using an inductance that is serially connected between the metal plate and the first metal layer corresponding to the via, an electromagnetic wave of a certain frequency range can be prevented from being transferred.

Another aspect of present invention features a printed circuit board.

The printed circuit board in accordance with another embodiment of the present invention can include: a first metal layer; a first dielectric layer, layer-built on the first metal layer; a mushroom type structure having a metal plate built on the first dielectric layer and a via of which one end is connected to the metal plate; a second dielectric layer, layer-built on the metal plate and the first dielectric layer; and a second metal layer, layer-built on the second dielectric layer. One end of the via can be placed in a hole formed on the first metal layer and connected to the first metal layer through a metal line.

Here, the first metal layer can be one of a ground layer and a power layer, and the second metal layer can be the other of the ground layer and the power layer.

The analog circuit can be an RF circuit having an antenna that receives an RF signal from the outside.

Also, the other end of the via can be connected to a via land placed in the hole, and the metal line can connect the via land and the first metal layer.

The hole can accommodate the via and the metal line.

Also, there can be a plurality of mushroom type structures between the first metal layer and the second metal layer.

Also, the metal line can be a straight line shape that connects the other end of the via and the first metal layer or a spiral shape.

Using an inductance that is serially connected between the metal plate and the first metal layer corresponding to the via, an electromagnetic wave of a certain frequency range can be prevented from being transferred.

Figure 1:
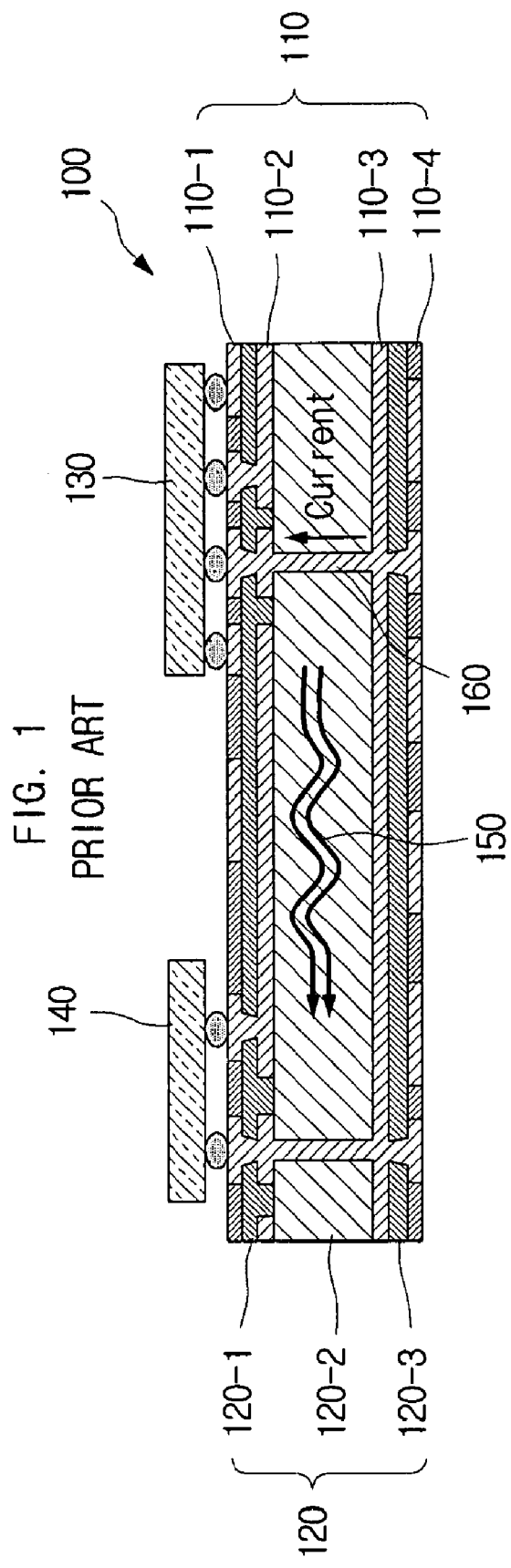
FIG. 1 is a cross-sectional view of a printed circuit board that consists of analog circuit and digital circuit.
Figure 2:
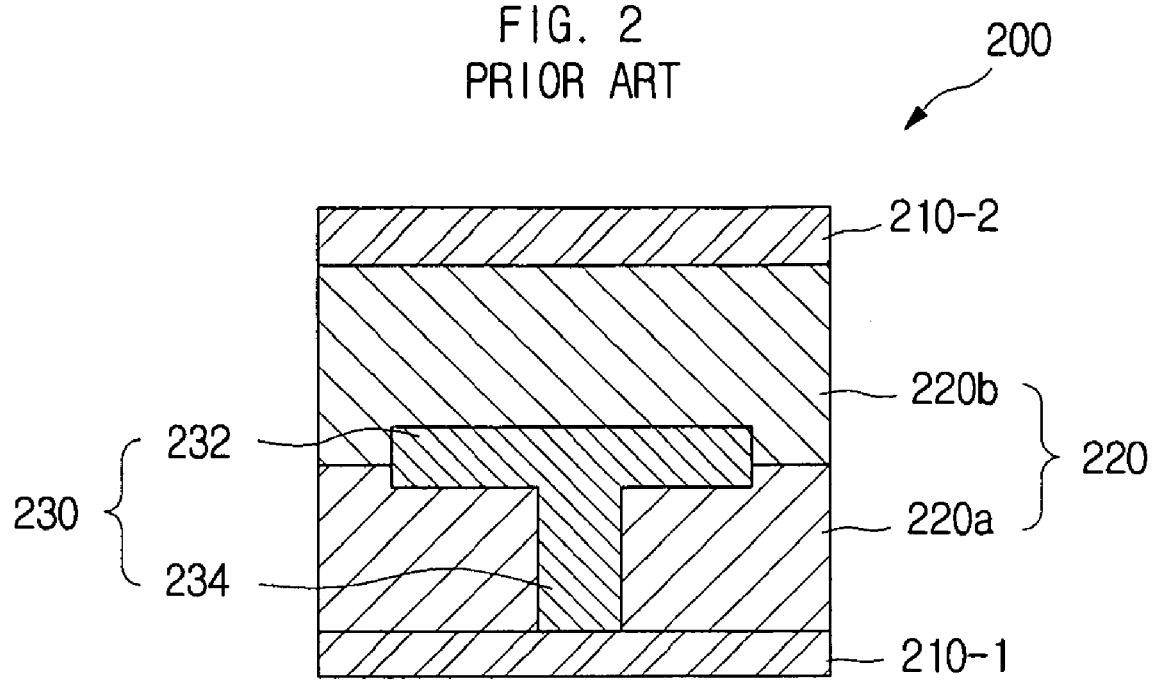
FIG. 2 illustrates the cross section of the related art, electromagnetic bandgap structure solving the mixed signal problem between the analog circuit and digital circuit.
Figure 3:
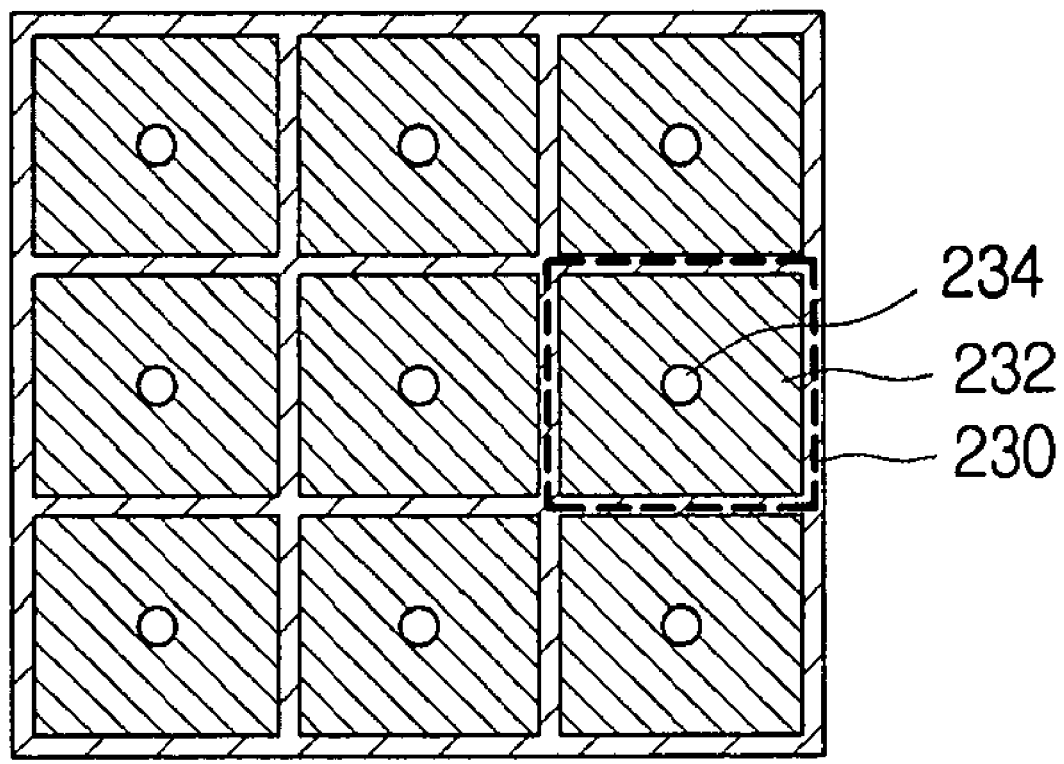
FIG. 3 illustrates a plan of metal plates arrangement of electromagnetic bandgap structure in FIG. 2.
Figure 4:
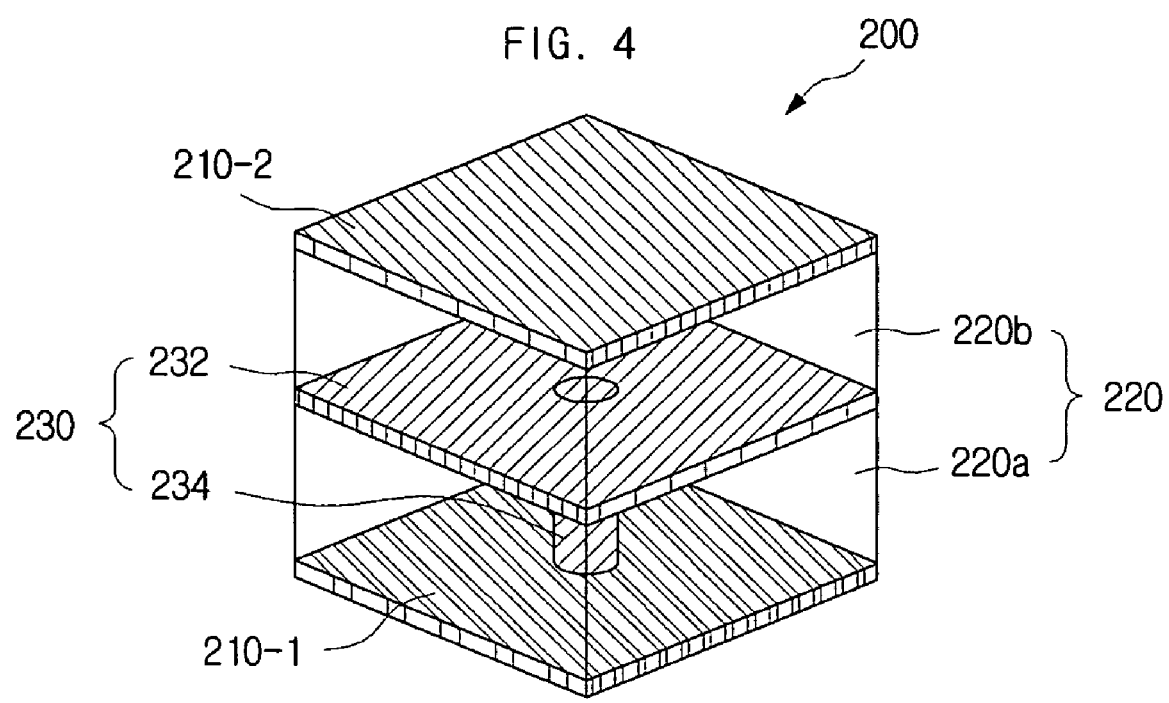
FIG. 4 illustrates a solid body of electromagnetic bandgap structure in FIG. 2.
Figure 5:
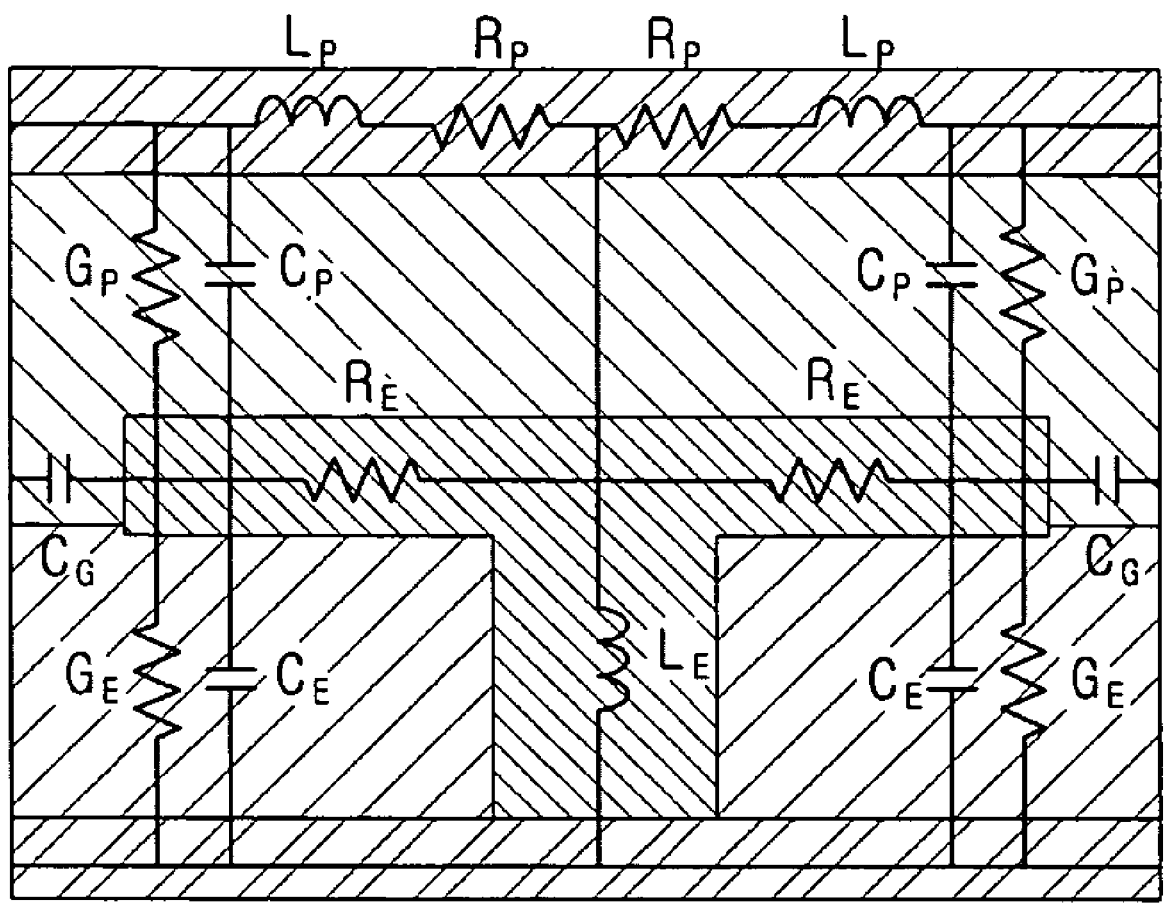
FIG. 5 illustrates the equivalent circuit of electromagnetic bandgap structure in FIG. 2.

| | |
|---|---|
| 100: a printed circuit board | |
| 130: a digital circuit | 140: aanalog circuit |
| 300, 400, 500, 600: an electromagnetic bandgap structure | |
| 330b, 510a: a first metal layer | 310, 510b: a second metal layer |
| 350: a first metal plate | 330a: a second metal plate |
| 340, 534: a via | 333, 410, 540, 545: a metal line |

DESCRIPTION OF THE EMBODIMENTS

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention. Throughout the drawings, similar elements are given similar reference numerals. Throughout the description of the present invention, when describing a certain technology is determined to evade the point of the present invention, the pertinent detailed description will be omitted.

Terms such as "first" and "second" can be used in describing various elements, but the above elements shall not be restricted to the above terms. The above terms are used only to distinguish one element from the other. For instance, the first element can be named the second element, and vice versa, without departing the scope of claims of the present invention. The term "and/or" shall include the combination of a plurality of listed items or any of the plurality of listed items.

When one element is described as being "connected" or "accessed" to another element, it shall be construed as being connected or accessed to the other element directly but also as possibly having another element in between. On the other hand, if one element is described as being "directly connected" or "directly accessed" to another element, it shall be construed that there is no other element in between.

The terms used in the description are intended to describe certain embodiments only, and shall by no means restrict the present invention. Unless clearly used otherwise, expressions in the singular number include a plural meaning. In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

Unless otherwise defined, all terms, including technical terms and scientific terms, used herein have the same meaning as how they are generally understood by those of ordinary skill in the art to which the invention pertains. Any term that is defined in a general dictionary shall be construed to have the same meaning in the context of the relevant art, and, unless otherwise defined explicitly, shall not be interpreted to have an idealistic or excessively formalistic meaning.

Hereinafter, some embodiments of the present invention will be described in detail with reference to the accompanying drawings.

Figure 6:
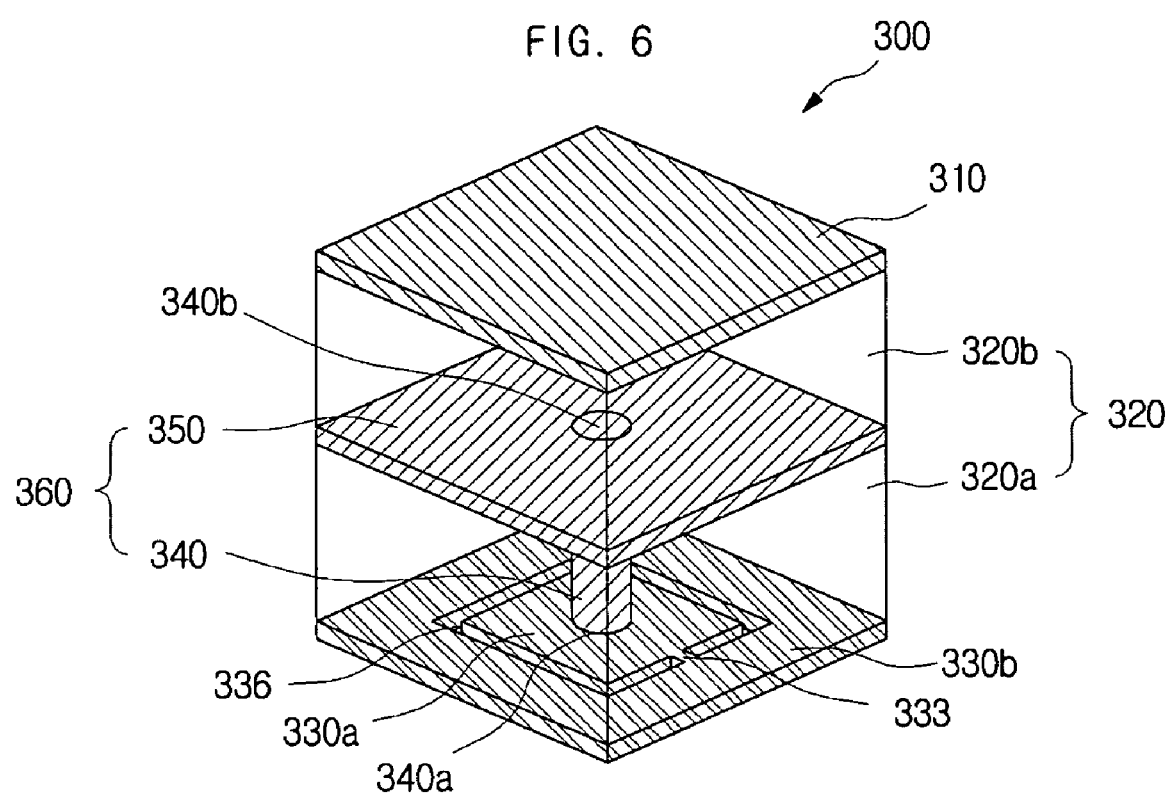
FIG. 6 is a perspective view showing an electromagnetic bandgap structure in accordance with the first embodiment of the preset invention which solves a mixed signal problem between an analog circuit and a digital circuit.
Figure 7:
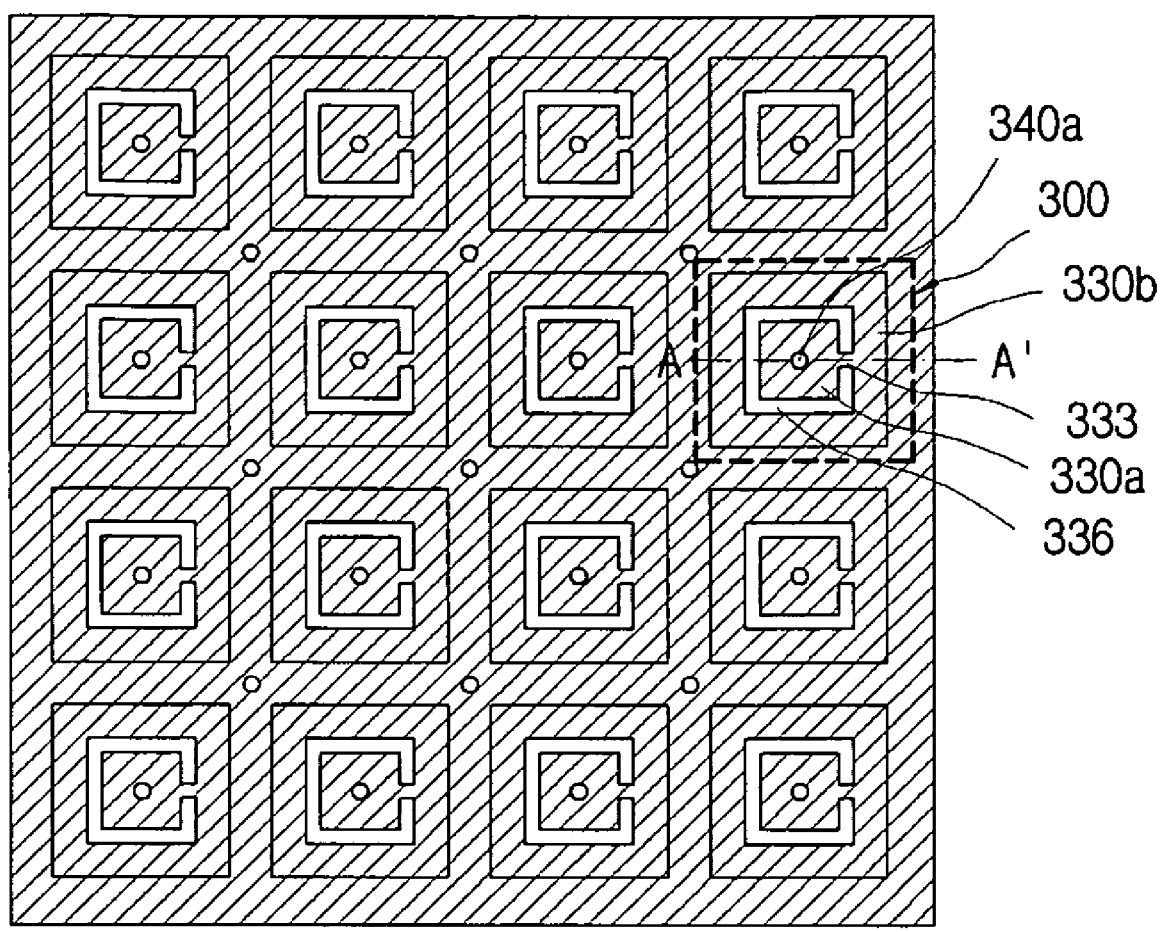
FIG. 7 is a plan view showing a metal plate configuration of the electromagnetic bandgap structure shown in FIG. 6.
Figure 8:
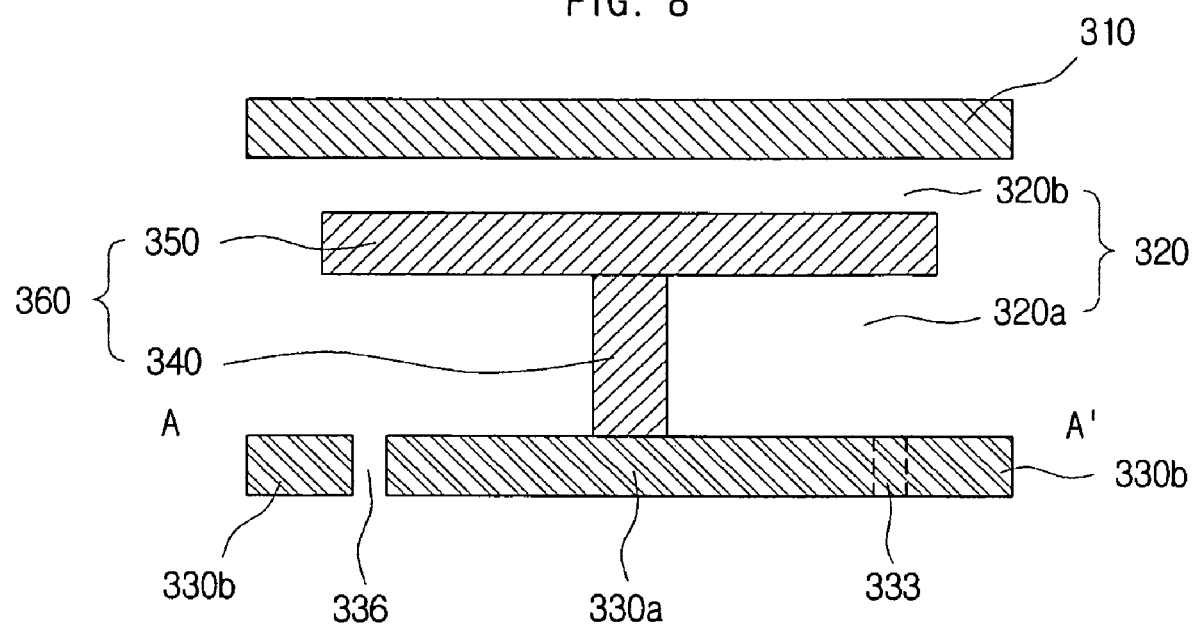
FIG. 8 is a sectional view showing an electromagnetic bandgap structure of the present invention according to the A-A' line of FIG. 7.

FIG. 6 is a perspective view showing an electromagnetic bandgap structure in accordance with a first embodiment of the preset invention that solves a mixed signal problem between an analog circuit and a digital circuit, and FIG. 7 is a plan view showing a metal plate configuration of the electromagnetic bandgap structure shown in FIG. 6. FIG. 8 is a sectional view showing an electromagnetic bandgap structure of the present invention according to the A-A' line of FIG. 7.

In accordance with the first embodiment of the present invention, a bandgap structure 300 includes a mushroom type structure 360, which includes a first metal plate 350 and a via 340, a second metal plate 330a, a first metal layer 330b, a second metal layer 310, a first dielectric layer 320a and a second dielectric layer 320b.

The mushroom type structure 360 includes the first metal layer 350 of a predetermined size and the via 340, of which one end is connected to the first metal plate 350 and the other end is connected to the second metal plate 330a.

The second metal plate 330a is connected through the first metal layer 330b and a metal line 333 and located on the same plane with first metal layer 330b. In the first metal layer 330b, a hole(336) is formed to accept the second metal plate 330a and inner wall of the hole of the first metal layer 330b and a outer side wall of the second metal plate 330a is dislocated with predetermined distance and the first metal layer 330b and the second metal plate 330a is connected only through the metal line 333.

If FIG. 6 is looked from the top, the first metal plate 350 is larger than the metal plate 330a, and on the plane, the first metal plate 350 is overlapped with the whole second metal plate 330a and some portion of the metal layer 330b.

Between a first layer, which consists of the second metal plate 330a and the first metal layer 330b, and the first metal plate 350, a first dielectric layer 320a is formed. Between the first metal plate 350 and the second metal layer 310, a second dielectric layer 320b is formed. The dielectric layer is divided into the first dielectric layer 320a and the second dielectric layer 320b according to the time it is formed based on the first metal plate 350.

The first metal layer 330b, the second metal layer 310, the first metal plate 350, the second metal plate 330a and the via 340 are made of a metal material such as copper that can be provided with power and transmit a signal.

The first dielectric layer 320a and the second dielectric layer 320b can be made of the same dielectric material or different dielectric materials having the same or different dielectric constants.

In case the first metal layer 330b is a ground layer, the second metal layer 310 is a power layer, and in case the first metal layer 330b is a power layer, the second metal layer 310 is a ground layer. In other words, either of the first metal layer 330b and the second metal layer 310 is a power layer or a ground layer with the dielectric layer 320 between them.

The first metal plate 350 is illustrated to be a square but can be a various shape, such as a polygon, a circle or an ellipse. The second metal plate 330a is also illustrated to be a square but can be a various shape, such as a polygon, a circle or an ellipse.

A method of forming the electromagnetic bandgap structure 300 is as follow.

After layer building the first layer including the first metal layer 330b and the second metal plate 330a, the first layer is patterned such that the first metal layer 330b and the second metal plate 330a are connected through the metal line 333 only. As masking, exposing to light, etching and photolithography are generally used to pattern a circuit in a printed circuit board, and description about these methods will be omitted.

On the first metal layer 330b and the second metal plate 330a, which are connected only through the metal line 333, the first dielectric layer 320a is layer-built. Then, a via that penetrate the dielectric layer 320a is formed by a drilling process such that the first metal layer 330b and the second metal plate 330a, which are to be layer-built on the first dielectric layer 320a, can be connected electrically.

After the via is formed, a plating process is performed to allow a plating layer to be formed on the internal wall of the via in order to electrically connect the first metal plate 350 to the second metal plate 330a. Depending on the plating process, a plating layer can be formed on the internal wall of the via excluding the center part among the inside part of the via, or the entire inside part of the via can be completely filled. In case the inside part of the via has an empty center part, the empty center part can be filled with a dielectric material or air. The formation of via is obvious to any person skilled in the art, and thus no more detail will be described herein.

The via 340 can have one end part 340a connected to the first metal plate 350, and the other end part 340b connected to the second metal plate 330a.

One or more mushroom type structures 360 including the first metal plate 350 and the via 340 can be formed between the first metal layer 330b and the second metal layer 310. Corresponding to a location where each mushroom type structure 360 is formed, formed on the first metal layer 330b is a hole, in which the second metal plate 330a, which is connected to the first metal layer 330b only through the metal line 333, is formed and connected to the via 340 of the mushroom type structure 360.

The first metal plate 350 of the mushroom type structure 360 can be arranged on the same planar surface or different planar surfaces between the first metal layer 330b and the second metal layer 310. Although, in FIG. 6, the via 340 of the mushroom type structure 360 faces the first metal layer 330b, the via 340 can face the second metal layer 310, and the second metal plate can be formed on the same planar surface as the second metal layer 310.

Moreover, it is possible that every via 340 of a plurality of mushroom type structure 360 faces the first metal layer 330b or the second metal layer 310 or the vias 340 of one group of the mushroom type structures 360 face the first metal layer 330b and the vias 340 of the other group face the second metal layer 310.

FIG. 7 illustrates that the mushroom type structures 360 are spaced from each other at predetermined intervals and are repeatedly arranged. The repeated formation of the mushroom type structures 360 makes it possible to block a signal having a frequency band corresponding to an operation frequency band of an analog circuit (e.g. an RF circuit) among an electromagnetic wave proceeding from a digital circuit to the analog circuit.

By forming the structure of the second metal plate 330a on the first metal layer 330b connected to the via 340 in the mushroom type structure 360, the bandgap frequency does not increase but has a low value even though the size of the mushroom type structure 360 is small. The second metal plate 330a increases a capacitance value between the second metal plate 330a and the first metal plate 350.

Bandgap frequency means a frequency of an EM wave that is suppressed from being transmitted from one side to the other side of the electromagnetic bandgap structure 300. In an embodiment of the present invention, 0.8~2.0 GHz, the operating frequency range of the RF circuit of a mobile communication terminal corresponds to the bandgap frequency range.

Figure 9:
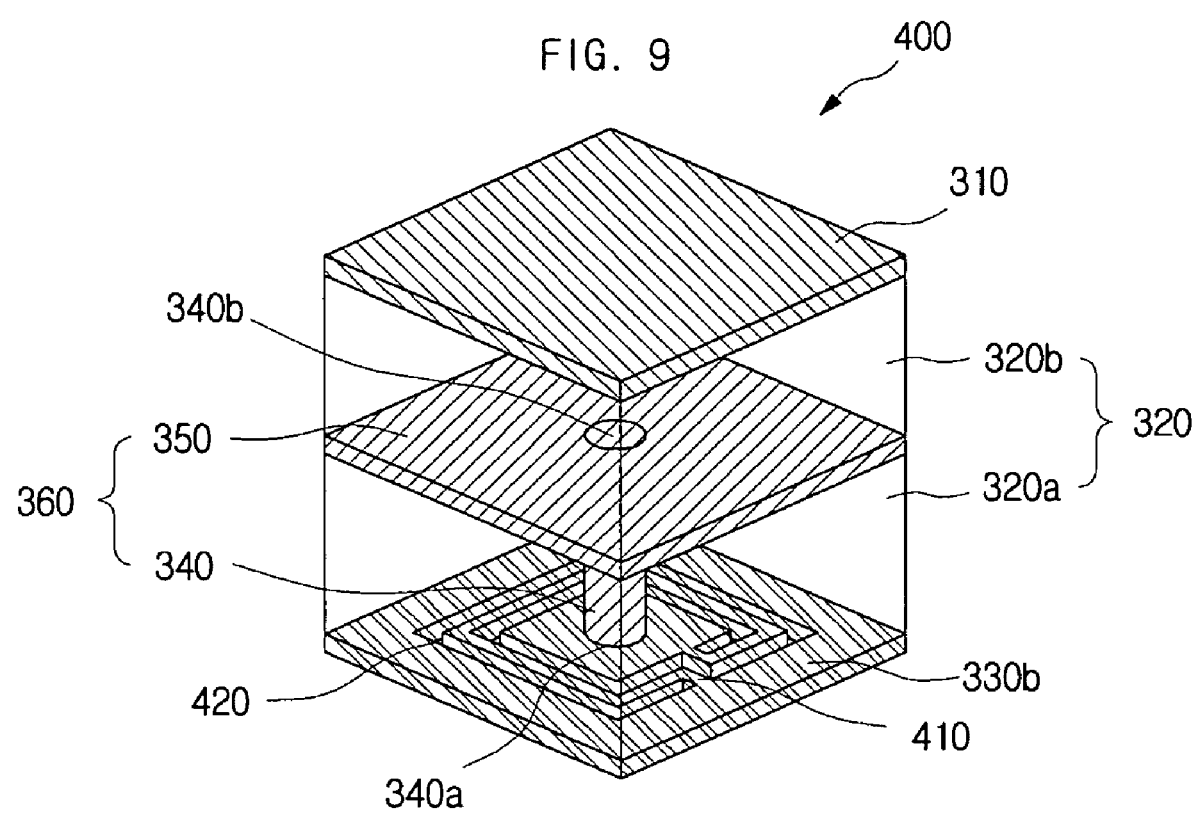
FIG. 9 is a perspective view showing an electromagnetic bandgap structure in accordance with the second embodiment of the preset invention which solves a mixed signal problem between an analog circuit and a digital circuit.
Figure 10:
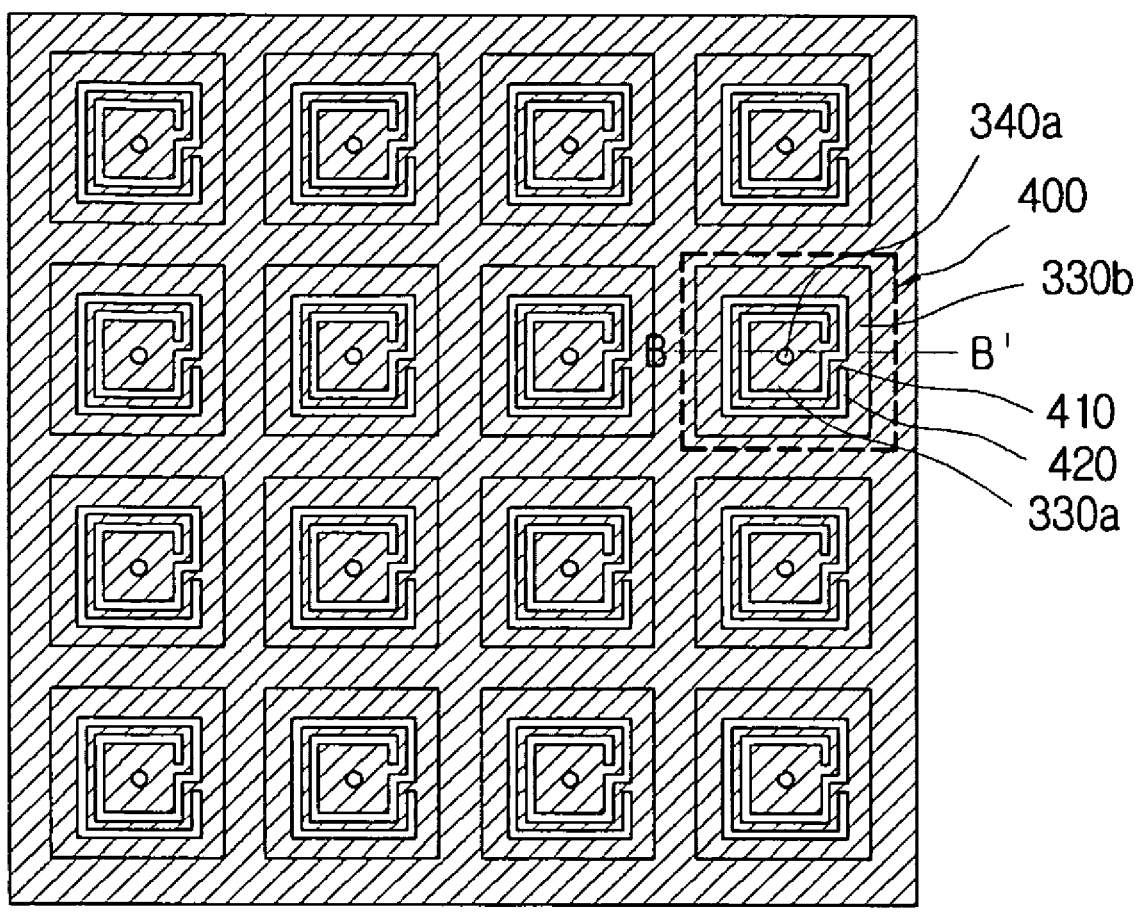
FIG. 10 is a plan view showing a metal plate configuration of the electromagnetic bandgap structure shown in FIG. 9.
Figure 11:
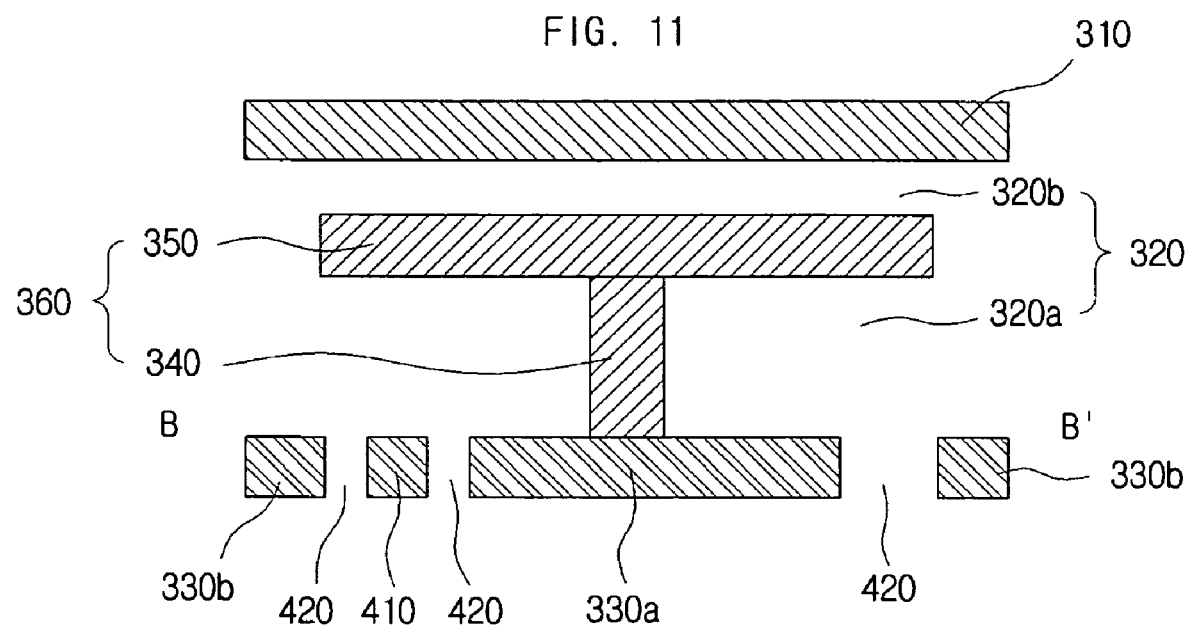
FIG. 11 is a sectional view showing an electromagnetic bandgap structure of the present invention according to the B-B' line of FIG. 10.

FIG. 9 is a perspective view showing an electromagnetic bandgap structure in accordance with a second embodiment of the preset invention that solves a mixed signal problem between an analog circuit and a digital circuit, and FIG. 10 is a plan view showing a metal plate configuration of the electromagnetic bandgap structure shown in FIG. 9. FIG. 11 is a sectional view showing an electromagnetic bandgap structure of the present invention according to the B-B' line of FIG. 10. Hereinafter, any description of the same elements of the electromagnetic bandgap structure 300 with reference to FIG. 6 to FIG. 8 will be omitted, and only the difference will be mainly described.

An electromagnetic bandgap structure 400 in accordance with the second embodiment of the present invention includes a mushroom type structure 360 comprising a first metal plate 350 and a via 340, a second metal plate 330a, a first metal layer 330b, a second metal layer 310, a first dielectric layer 320a and a second dielectric layer 320b.

Though the metal line 333 of the electromagnetic bandgap structure 300 in accordance with the first embodiment of the present invention has a straight line shape, a metal line 410 of the electromagnetic bandgap structure 300 in accordance with the second embodiment of the present invention that connects the first metal layer 330b and the second metal plate 330a has a spiral shape. Because the metal line 410 has a spiral structure, a sufficient value of inductance can be provided between the first metal layer 330b and the second metal plate 330a.

On the first metal layer 330b, a hole that can accommodate both the spiral structure metal line 410 and the second metal plate 330a is formed. The inner wall of the hole 420 is spaced from the metal line 410 by a predetermined distance and both ends of the metal line 410 are connected electrically to the first metal layer 330b and the second metal plate 330a.

The second metal plate 330a increases a capacitance value between the second metal plate 330a and the first metal plate 350. Moreover, the spiral structure metal line 410 allows an enough value of inductance, which is serially connected between the second metal plate 330a and the first metal layer 330b, to be provided.

Even though the spiral structure metal line 410 is wound just once around the second metal plate 330a, it shall be understood that the present invention does not restrict the number of winding.

Figure 12:
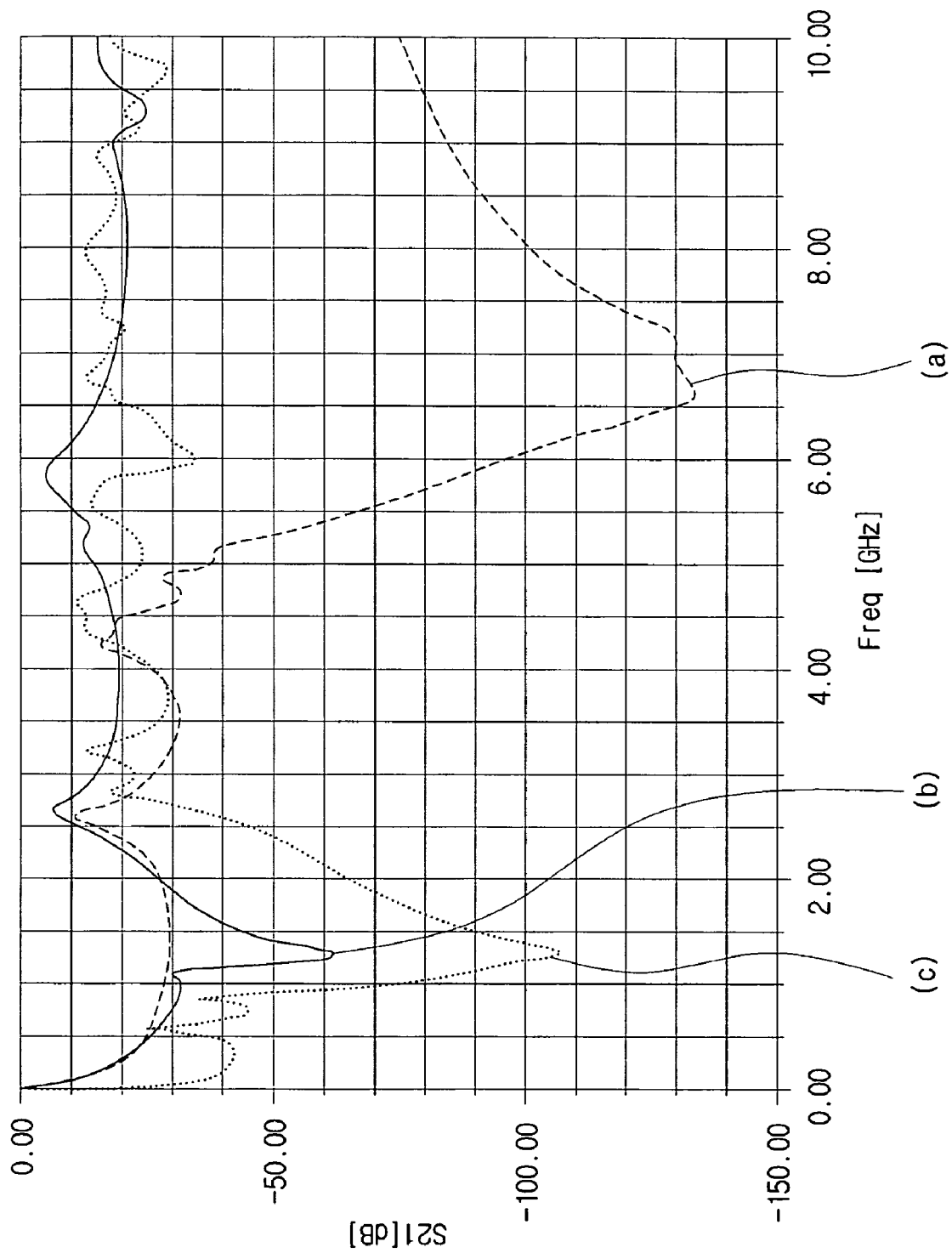
FIG. 12 is the computer the simulation result using the electromagnetic bandgap structure of the present invention and the electromagnetic bandgap structure of the related art.

Represented in FIG. 12 is a computer simulation result of using the electromagnetic bandgap structure (i.e. aforementioned electromagnetic bandgap structure) of the present invention and the electromagnetic bandgap structure 200 of the related art.

FIG. 12 illustrates the cases in which the size of the electromagnetic bandgap structure 200 of the related art (i.e. size of the metal plate 232) is 4 mm² (2×2) (refer to (a)) and 81 mm² (9×9) to (b)).

When the size of the structure is 4 mm² (2×2) (refer to (a)), the frequency of which the noise level is below −50 dB is 5.5 GHz or higher.

When the size of the structure is 81 mm² (9×9) (refer to (b)), the frequency of which the noise level is below −50 dB is 1.2~1.45 GHz and the frequency of which the noise level is lowest is 1.3 GHz.

Hence, in accordance with the electromagnetic bandgap structure 200 of the related art, the size of the structure must be 81 mm² (9×9) (refer to (b)) since the noise must be blocked by placing the bandgap frequency within 0.8~2.0 GHz, which is the operating frequency range of the RF circuit in a mobile communication terminal.

However, in accordance with the electromagnetic bandgap structure of the present invention, in case the size of the electromagnetic bandgap structure (i.e. size of the metal plate 232) is 4 mm² (2×2) (refer to (a)), the frequency of which the noise level is below −50 dB is 0.8~2.4 GHz and the frequency of which the noise level is lowest is 1.3 GHz.

This is represented in Table 1 below.

TABLE 1

|  | Bandgap frequency | Size of the structure | Noise level |
| --- | --- | --- | --- |
| The structure of the related art | 7.5 GHz | 4 mm² (2 × 2) | −50 dB |
|  | 1.3 GHz | 81 mm² (9 × 9) | −50 dB |
| The structure of the present invention | 1.3 GHz | 81 mm² (9 × 9) | −50 dB |

Therefore, in accordance with the electromagnetic bandgap structure of the present invention, the same bandgap frequency with the electromagnetic bandgap structure 200 of the related art can be provided while the size is more than 1/20 times smaller (81 mm²→4 mm²).

Furthermore, even when the size of the electromagnetic bandgap structure of the present invention is the same as that of the electromagnetic bandgap structure of the related art, the bandgap frequency is over 1/5 times lower (7.5 GHz→1.3 GHz).

The printed circuit board in accordance with an embodiment of the present invention includes an analog circuit and a digital circuit. The analog circuit can be an RF circuit, which receives an RF signal from the outside.

In the printed circuit board, the electromagnetic bandgap structure 300 or 400 illustrated in FIG. 6 to FIG. 11 is arranged between the analog circuit and the digital circuit. That is, the electromagnetic bandgap structure 300 or 400 is arranged between the RF circuit 140 and the digital circuit 130 in the printed circuit board shown in FIG. 1.

The electromagnetic bandgap structure 300 or 400 is arranged for the EM wave transferred to the RF circuit 130 to pass through the electromagnetic bandgap structure 300 or 400. Accordingly, the electromagnetic bandgap structure 300 or 400 can be arranged in a closed loop-shape around the RF circuit 130 or around the digital circuit 140.

Alternatively, the electromagnetic bandgap structure 300 or 400 can be arranged anywhere between the digital circuit 140 and the RF circuit 130 in the printed circuit board.

By arranging the electromagnetic bandgap structure 300 or 400 inside the printed circuit board, the printed circuit board concurrently implementing both the analog circuit and the digital circuit can prevent the EM wave of a certain frequency range (for example, 0.8~2.0 GHz) from being transferred.

Therefore, despite the small size, it is possible to solve the aforementioned mixed signal problem by preventing the EM wave of a certain frequency range from being transferred.

Figure 13:
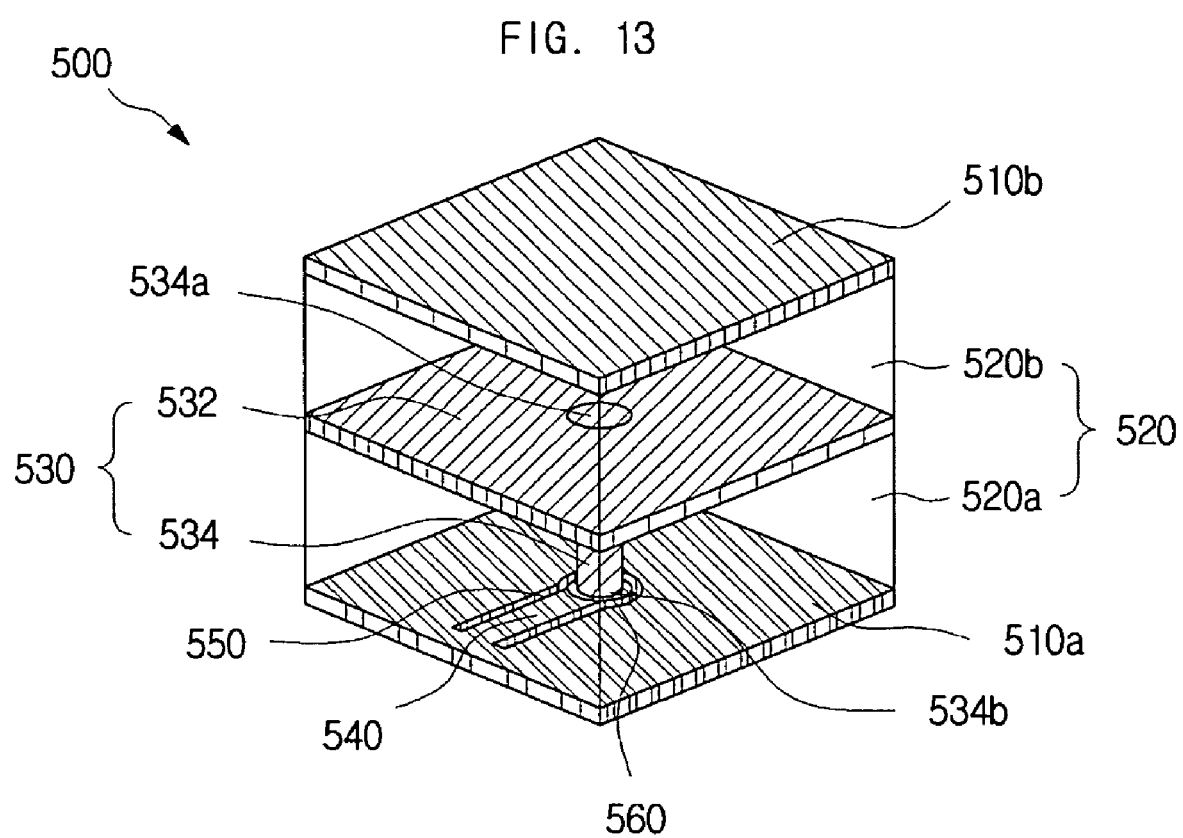
FIG. 13 is a perspective view showing an electromagnetic bandgap structure in accordance with the third embodiment of the preset invention which solves a mixed signal problem between an analog circuit and a digital circuit.
Figure 14:
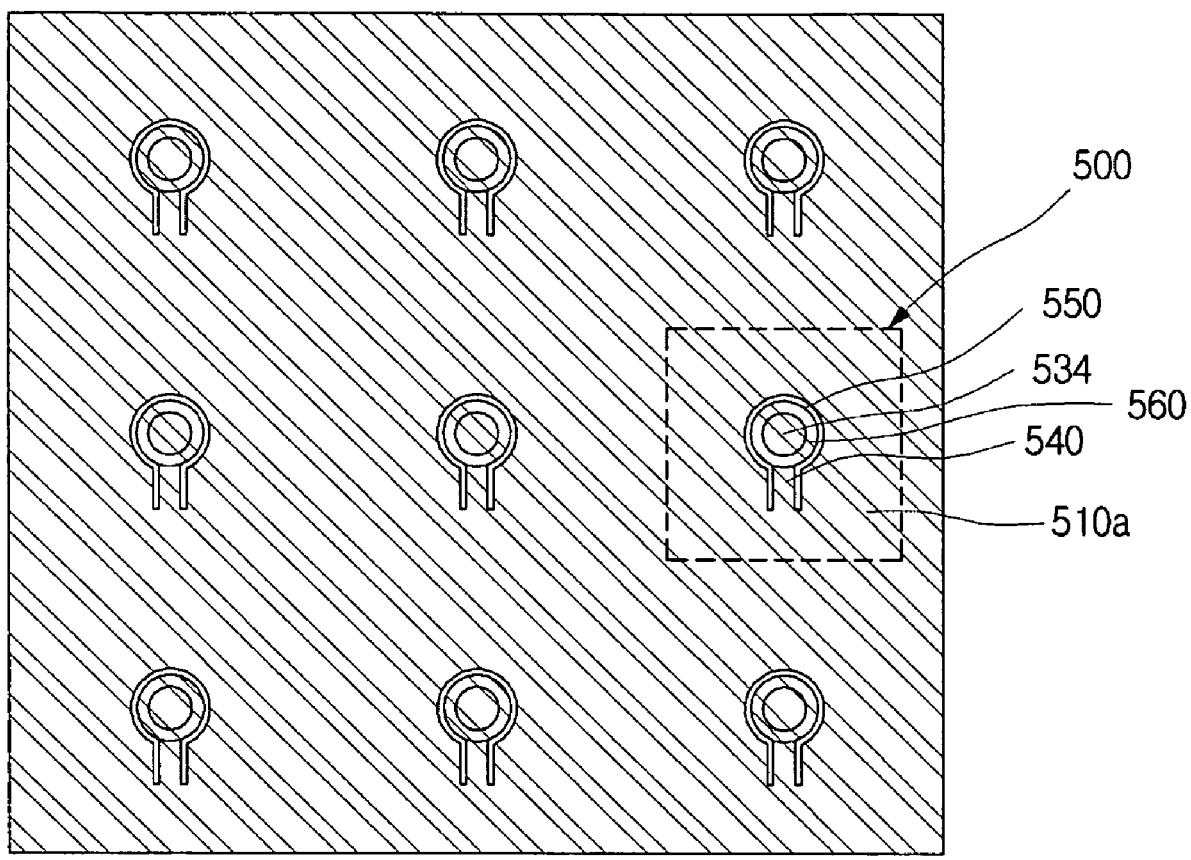
FIG. 14 is a plan view showing a metal plate configuration of the electromagnetic bandgap structure shown in FIG. 13.
Figure 15:
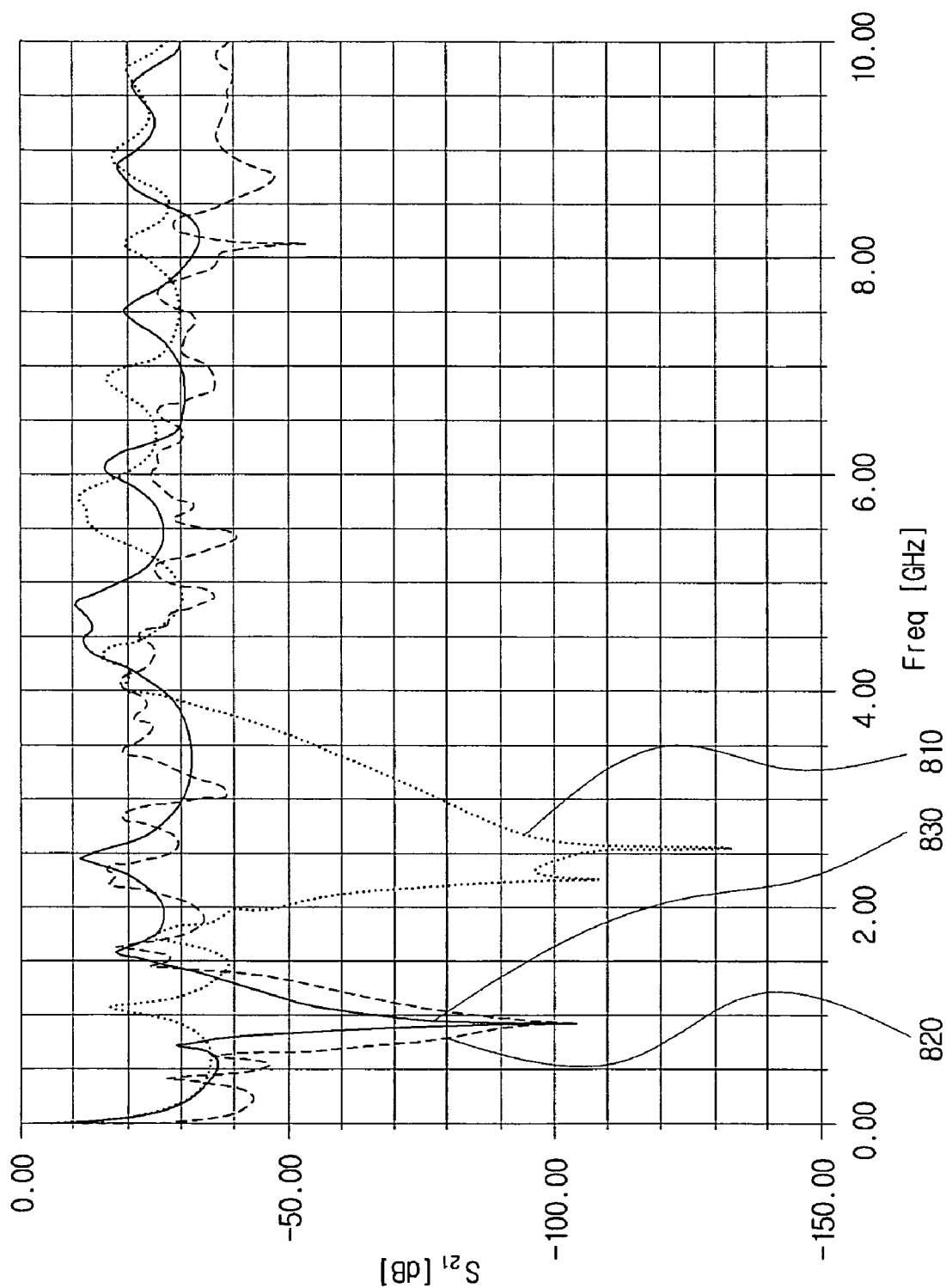
FIG. 15 illustrates computer simulation result using the electromagnetic bandgap structure of the present invention referred to FIG. 13 and the electromagnetic bandgap structure of the related art.

FIG. 13 is a perspective view showing an electromagnetic bandgap structure in accordance with a third embodiment of the preset invention that solves a mixed signal problem between an analog circuit and a digital circuit, and FIG. 14 is a plan view showing a metal plate configuration of the electromagnetic bandgap structure shown in FIG. 13. FIG. 15 illustrates computer simulation results using the electromagnetic bandgap structure of the present invention illustrated in FIG. 13 and the electromagnetic bandgap structure of the related art.

A bandgap structure 500 in accordance with the first embodiment of the present invention includes a mushroom type structure 530 comprising a metal plate 532 and a via 534, a first metal layer 510a, a second metal layer 510b, a first dielectric layer 520a and a second dielectric layer 520b. The mushroom type structure 530 consists of the first metal layer 532 of a predetermined size and the via 534 of which one end 534a is connected to the metal 532 and the other end 534b is connected to the first metal layer 510a.

The first metal layer 510a and the metal plate 532 are connected through the via 534. More particularly, one end of the via is connected to a via land 560, and the via land 560 is connected to the first metal layer 510a through a metal line 540, or the other end of the via 534 is connected to the first metal layer 510a without a via land.

Between the first metal layer 510a and the second metal layer 510b, a dielectric layer 520 is formed. The dielectric layer 520 is divided into the first dielectric layer 520a and the second dielectric layer 520b based on the time the first metal layer 532 is formed.

The first metal layer 510a, the second metal layer 510b, the metal plate 532, and the via 534 are made of a metal material such as copper that can be provided with power and transmit a signal.

The first dielectric layer 520a and the second dielectric layer 520b can be made of the same dielectric material or a different dielectric material having the same or different dielectric constant.

In case the first metal layer 510a is a ground layer, the second metal layer 510b is a power layer, and in case the first metal layer 510a is a power layer, the second metal layer 510b is a ground layer. In other words, Either of the first metal layer 510a and the second metal layer 510b is a power layer or ground layer with the dielectric layer 520 between them.

Although the metal plate 532 is illustrated as a square, the metal plate 532 can have any shape, such as a polygon, a circle or an ellipse.

Formed in the first metal layer 510a are the other end 534b of the via 534 and a hole 550, which accommodates the metal line 340.

A method of forming the electromagnetic bandgap structure 500 is as follow.

The first metal layer 510a is layer-built. Then, the metal line 540, which connects the first metal layer 510a and via 534, is patterned. If a via land is required, the via land 560 is also patterned. Masking, exposing light, etching and photolithography are generally used in the patterning, and description about these methods will be omitted.

Then, after the first dielectric layer 520a is layer-built on the first metal layer 510a, the via 534 that penetrates through the dielectric layer 320a is formed by a drilling process such that for the metal plate 532 and the first metal plate 510a, which are to be layer-built on the first dielectric layer 520a, are connected electrically. After the via is formed, a plating process is performed to allow a plating layer to be formed on the internal wall of the via in order to electrically connect the first metal layer 510a to the metal plate 532.

The via 534 can have one end part 534a, connected to the metal plate 532, and the other end part 534b, connected to the first metal plate 510a.

After that, by successively layer-building the second dielectric layer 520b and the second metal layer 510b, the electromagnetic structure 500 is formed.

At least one mushroom type structure 530 including the metal plate 532 and the via 534 can be formed between the first metal layer 510a and the second metal layer 510b. The metal plate 532 of the plurality of mushroom type structures 530 can be arranged on the same planar surface or different planar surfaces between the first metal layer 510a and the second metal layer 510b. Though, in FIG. 13, the via 534 of the mushroom type structure 530 faces the first metal layer 510a, it is possible that the via 534 faces the second metal layer 510b.

Moreover, it is possible that every via 534 of the plurality of mushroom type structures 530 faces the first metal layer 510a or the second metal layer 510b or that the vias 534 of one group of the mushroom type structure 530 face the first metal layer 510a and the vias 534 of the other group face the second metal layers 510b.

FIG. 14 illustrates that the mushroom type structures 530 are spaced from each other at predetermined intervals and are repeatedly arranged. The repeated formation of the mushroom type structures 530 makes it possible to block a signal having a frequency band corresponding to an operation frequency band of an analog circuit (e.g. an RF circuit) from an electromagnetic wave proceeding from the digital circuit to the analog circuit.

By forming the metal line 540 on the first metal layer 510a connected to the via 534 in the mushroom type structure 530, a capacitance value (CE) between the metal plate 532 and the second metal layer 510b becomes small enough to be ignored. Corresponding to the via 534 and the metal line 540, enough value of inductance between the first metal layer 330b and the second metal plate 330a can be provided. Therefore, even if the size of the mushroom structure 530 is small, the bandgap frequency does not increase and has a low value. Bandgap frequency means the frequency of an EM wave that is suppressed from being transmitted from one side to the other side of the electromagnetic bandgap structure 500. In an embodiment of the present invention, 0.8~2.0 GHz, the operating frequency range of an RF circuit in a mobile communication terminal corresponds to the bandgap frequency range.

Illustrated in FIG. 15 is the simulation result using the electromagnetic bandgap structure in accordance with the third embodiment of the present invention and the electromagnetic bandgap structure 200 of the related art.

FIG. 15 illustrates the cases in which the size of the electromagnetic bandgap structure 200 of the related art (i.e. size of the metal plate 232) is 49 mm² (7×7) (refer to 810) and 324 mm² (18×18) (refer to 820).

When the size of the structure is 49 mm² (7×7) (refer to 810), the frequency of which the noise level is below −50 dB is 2.8 GHz or higher.

When the size of the structure is 324 mm² (18×18) (refer to 820), the frequency of which the noise level is below −50 dB is 0.6~1.4 GHz, and the frequency of which the noise level is lowest is 1 GHz.

In accordance with the electromagnetic bandgap structure 200 of the related art, the size of the structure must be 324 mm² (18×18) (refer to 820) since the noise must be blocked by placing the operating frequency range within 0.8~2.0 GHz of the RF circuit in a mobile communication terminal.

However, in accordance with the electromagnetic bandgap structure in accordance with the third embodiment of the present invention, when the size of the electromagnetic bandgap structure (i.e. size of the metal plate 532) is 49 mm² (7×7) (refer to 810), the frequency of which the noise level is below −50 dB is 0.8~2.4 GHz, and the frequency of which the noise level is lowest is 1.3 GHz.

This is represented in Table 2 below.

TABLE 2

|  | Bandgap frequency | Size of the structure | Noise level |
| --- | --- | --- | --- |
| The structure of the related art | 2.8 GHz | 49 mm² (7 × 7) | −50 dB |
|  | 1 GHz | 324 mm² (18 × 18) | −50 dB |
| The structure of the present invention | 1 GHz | 324 mm² (18 × 18) | −50 dB |

Therefore, the electromagnetic bandgap structure in accordance with the third embodiment of the present invention can have the same bandgap frequency as the electromagnetic bandgap structure 200 of the related art, and the size can be more than ⅙ times smaller (324 mm²→49 mm²).

Moreover, when the size of the electromagnetic bandgap structure of the present invention is the same as the electromagnetic bandgap structure of the related art, the bandgap frequency can be over ½ times lower (2.8 GHz→1 GHz).

Figure 16:
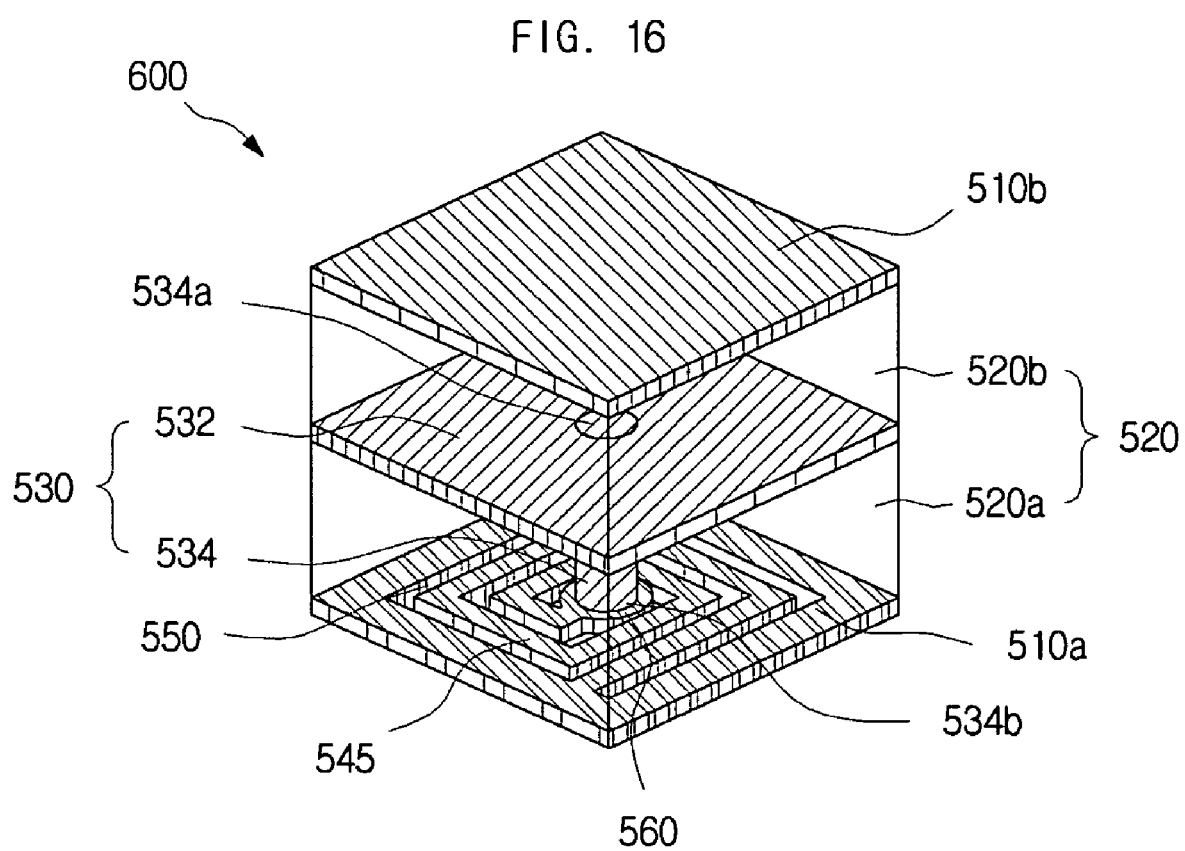
FIG. 16 is a perspective view showing an electromagnetic bandgap structure in accordance with the fourth embodiment of the preset invention which solves a mixed signal problem between an analog circuit and a digital circuit.
Figure 17:
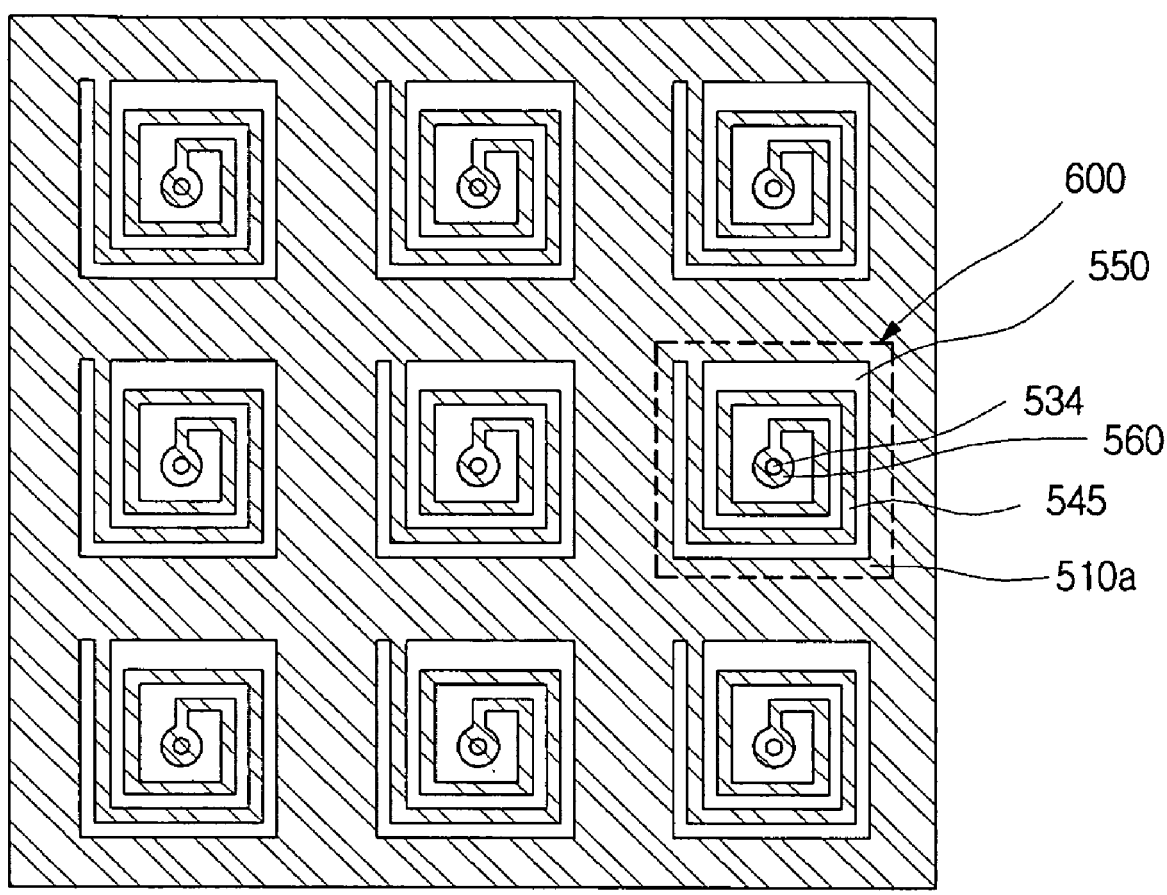
FIG. 17 is a plan view showing a metal plate configuration of the electromagnetic bandgap structure shown in FIG. 16.
Figure 18:
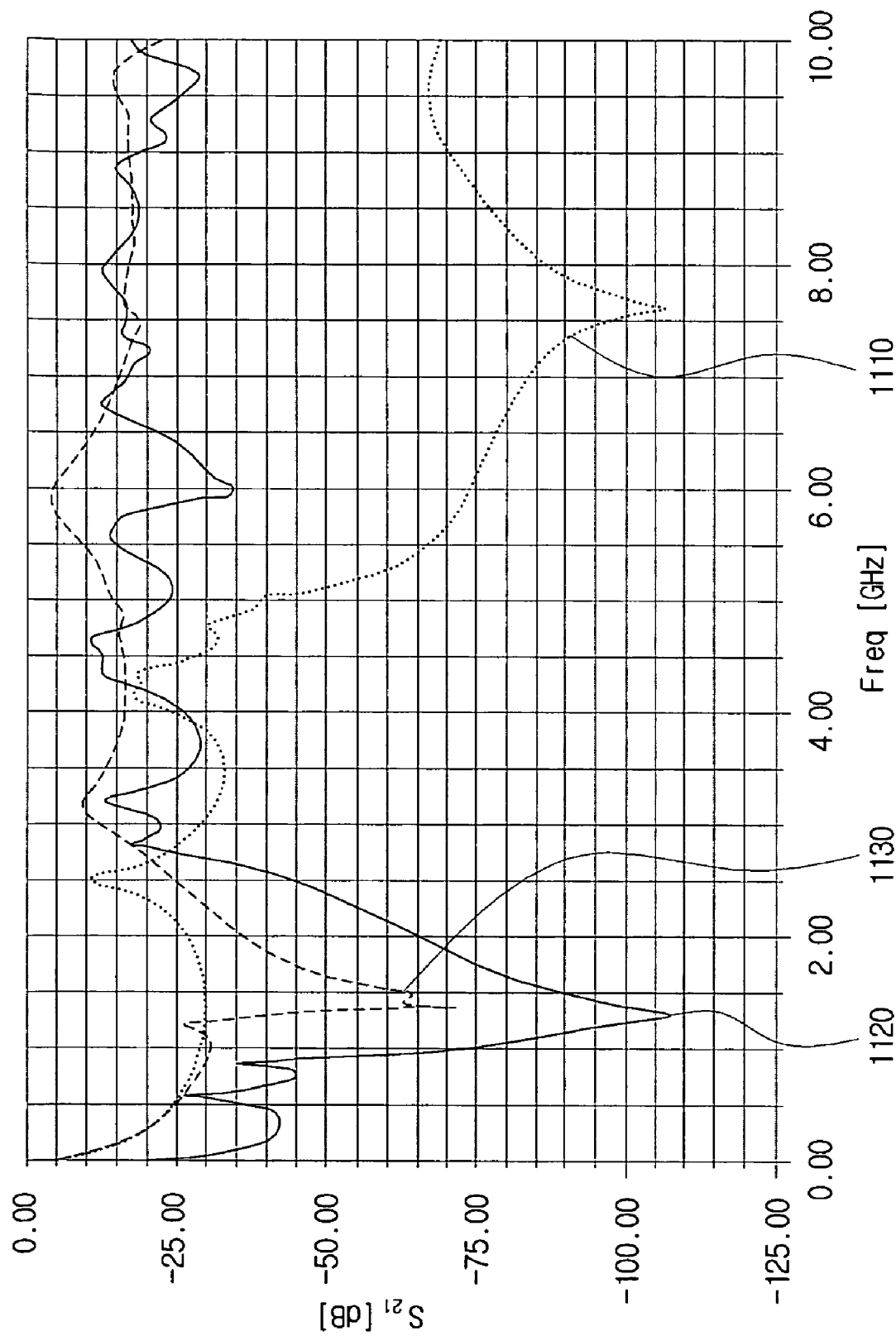
FIG. 18 illustrates computer simulation result using the electromagnetic bandgap structure of the present invention referred to FIG. 16 and the electromagnetic bandgap structure of the related art.

FIG. 16 is a perspective view showing an electromagnetic bandgap structure in accordance with a fourth embodiment of the preset invention that solves a mixed signal problem between an analog circuit and a digital circuit, and FIG. 17 is a plan view showing a metal plate configuration of the electromagnetic bandgap structure shown in FIG. 16. FIG. 18 illustrates a computer simulation result using the electromagnetic bandgap structure of the present invention shown in FIG. 16 and the electromagnetic bandgap structure of the related art.

Hereinafter, the same elements as the electromagnetic bandgap structure 500 described with reference to FIG. 13 to FIG. 15 will be omitted, and only the difference will be mainly described.

In accordance with the fourth embodiment of the present invention, a bandgap structure 600 includes a mushroom type structure 530 comprising a metal plate 532 and a via 534, a first metal layer 510a, a second metal layer 510b, a first dielectric layer 520a and a second dielectric layer 520b. The mushroom type structure 530 consists of the first metal layer 532 of a predetermined size and the via 534 of which one end 534a is connected to the metal 532 and the other end 534b is connected to the first metal layer 510a.

Though the metal line 540 of the electromagnetic bandgap structure 500 in accordance with the third embodiment of the present invention has a straight line shape, the metal line 545 of the electromagnetic bandgap structure 600 in accordance with the fourth embodiment of the present invention has a spiral shape. Because the metal line 545 has the spiral structure, an enough value of inductance can be provided between the first metal layer 510a and the second metal plate 532.

On the first metal layer 510a, a hole 550, which can accommodate both the spiral structure metal line 534 and the other end 534b of the via 534 (or additionally, a via land 560) is formed. The inner wall of the hole 550 is spaced from the metal line 545 by a predetermined distance and both ends of the metal line 545 are electrically connected to the first metal layer 510a and the second metal plate 534.

Even though the spiral structure metal line 545 is wound just one and a half times around the via 534, the present invention does not restrict the number of winding.

The result of computer simulation using the electromagnetic bandgap structure in accordance with the fourth embodiment of the present invention and the electromagnetic bandgap structure 200 of the related art is shown in FIG. 18.

FIG. 18 illustrates the cases in which the size of the electromagnetic bandgap structure 200 of the related art (i.e. size of the metal plate 232) is 4 mm² (2×2) (refer to 1110) and 81 mm² (9×9) (refer to 1120).

When the size of the structure is 4 mm² (2×2) (refer to 1110), the frequency of which the noise level is below −50 dB is 7.5 GHz or higher.

When the size of the structure is 81 mm² (9×9) (refer to 1120), the frequency of which the noise level is below −50 dB is 0.9~2.4 GHz, and the frequency of which the noise level is lowest is 1.3 GHz.

Thus, in accordance with the electromagnetic bandgap structure 200 of the related art, the size of the structure must be 81 mm² (9×9) (refer to 1120) since the noise must be blocked by placing the frequency range within 0.8~2.0 GHz, the operating frequency range of the RF circuit in a mobile communication terminal.

However, for the electromagnetic bandgap structure in accordance with the fourth embodiment of the present invention, in case that the size of the electromagnetic bandgap structure (i.e. size of the metal plate 532) is 4 mm² (2×2) (refer to 1110), the frequency of which the noise level is below −50 dB is 1.3~1.7 GHz, and the frequency of which the noise level is lowest is 1.5 GHz.

This is represented in Table 3 below.

TABLE 3

|  | Bandgap frequency | Size of the structure | Noise level |
| --- | --- | --- | --- |
| The structure of the related art | 7.5 GHz | 4 mm² (2 × 2) | −50 dB |
|  | 1.5 GHz | 81 mm² (9 × 9) | −50 dB |
| The structure of the present invention | 1.5 GHz | 81 mm² (2 × 2) | −50 dB |

That is, the electromagnetic bandgap structure in accordance with the fourth embodiment of the present invention can have the same bandgap frequency as the electromagnetic bandgap structure 200 of the related art, and the size can be over 1/20 times smaller (81 mm²→4 mm²).

Even when the size of the electromagnetic bandgap structure of the present invention is the same as that of the electromagnetic bandgap structure of the related art, the bandgap frequency can be over 1/5 times lower (7.5 GHz→1.5 GHz).

A printed circuit board in accordance with another embodiment of the present invention includes an analog circuit and a digital circuit. The analog circuit can be an RF circuit, which receives an RF signal from the outside.

In the printed circuit board, the electromagnetic bandgap structure 500 or 600 shown in FIG. 13, FIG. 14, FIG. 16 and FIG. 17 is arranged between the analog circuit and the digital circuit. Accordingly, the electromagnetic bandgap structure 500 or 600 is arranged between the RF circuit 140 and the digital circuit 130 shown in FIG. 1.

The electromagnetic bandgap structure 500 or 600 is arranged such that the EM wave transferred to the RF circuit 130 to pass through the electromagnetic bandgap structure 500 or 600. That is, the electromagnetic bandgap structure 500 or 600 can be arranged in a closed loop-shape around the RF circuit 130 or around the digital circuit 140.

Alternatively, the electromagnetic bandgap structure 500 or 600 can be arranged anywhere between the digital circuit 140 and the RF circuit 130 in the printed circuit board.

By arranging the electromagnetic bandgap structure 500 or 600 inside, the printed circuit board concurrently implementing both the analog circuit and the digital circuit can prevent the EM wave of a certain frequency range (for example, 0.8~2.0 GHz) from being transferred.

Therefore, despite the small size, it is possible to solve the aforementioned mixed signal problem by preventing the EM wave of a certain frequency range from being transferred.

Although some embodiments of the present invention have been shown and described for the above-described objects, it shall be appreciated by any person of ordinary skill in the art that a large number of modifications, permutations and additions are possible within the principles and spirit of the invention, the scope of which is defined by the appended claims and their equivalents.

What is claimed is:

1. An electromagnetic bandgap structure, comprising:
    a mushroom type structure comprising a first metal plate and a via of which one end is connected to the first metal plate;
    a second metal plate connected to the other end of the via;
    a first metal layer being connected to the second metal plate through a metal line;
    a first dielectric layer, layer-built between the first metal layer and the first metal plate;
    a second dielectric layer, layer-built on the first metal plate and the first dielectric layer; and
    a second metal layer, layer-built on the second dielectric layer.

2. The electromagnetic bandgap structure of claim 1, wherein the first metal layer and the second metal plate are placed on a same planar surface.

3. The electromagnetic bandgap structure of claim 2, wherein the metal line is placed on a same planar surface as the first metal layer and the second metal plate.

4. The electromagnetic bandgap structure of claim 1, wherein the second metal plate is accommodated in a hole formed in the first metal layer and is electrically connected through the metal line.

5. The electromagnetic bandgap structure of claim 4, wherein an inner wall of the hole is spaced from the second metal plate at a predetermined distance.

6. The electromagnetic bandgap structure of claim 1, wherein there are a plurality of mushroom type structures between the first metal layer and the second metal layer.

7. The electromagnetic bandgap structure of claim 6, wherein first metal plates of the plurality of mushroom type structures are placed on a same planar surface.

8. The electromagnetic bandgap structure of claim 6, wherein a same number of second metal plates as the number of mushroom type structures correspond to an arrangement of the plurality of mushroom type structures and are formed on a same planar surface as the first metal layer.

9. The electromagnetic bandgap structure of claim 1, wherein the metal line has a spiral structure that is wound around the second metal plate.

10. The electromagnetic bandgap structure of claim 1, wherein an electromagnetic wave of a certain frequency range is prevented from being transferred, by using an inductance that is serially connected between the first metal plate and the second metal plate corresponding to the via.

11. A printed circuit board having an analog circuit and a digital circuit, comprising:
   an electromagnetic bandgap structure being placed between the analog circuit and the digital circuit,
   the electromagnetic bandgap structure, comprising
   a mushroom type structure comprising a first metal plate and a via of which one end is connected to the first metal plate,
   a second metal plate connected to the other end of the via,
   a first metal layer being connected to the second metal plate through a metal line,
   a first dielectric layer, layer-built between the first metal layer and the first metal plate,
   a second dielectric layer, layer-built on the first metal plate and the first dielectric layer, and
   a second metal layer, layer-built on the second dielectric layer.

12. The printed circuit board of claim 11, wherein the first metal layer is one from the group consisting of a ground layer and a power layer, and the second metal layer is the other from the group consisting of the ground layer and the power layer.

13. The printed circuit board of claim 11, wherein the analog circuit is an RF circuit comprising an antenna receiving an RF signal from the outside.

14. The printed circuit board of claim 11, wherein the first metal layer and the second metal plate are placed on a same planar surface.

15. The printed circuit board of claim 11, wherein the metal line is placed on a same planar surface as the first metal layer and the second metal plate.

16. The printed circuit board of claim 11, wherein the second metal plate is accommodated in a hole formed in the first metal layer and is electrically connected through the metal line.

17. The printed circuit board of claim 16, wherein an inner wall of the hole is spaced from the second metal plate at a predetermined distance.

18. The printed circuit board of claim 11, wherein there are a plurality of mushroom type structures between the first metal layer and the second metal layer.

19. The printed circuit board of claim 18, wherein first metal plates of the plurality of mushroom type structures are placed on a same planar surface.

20. The printed circuit board of claim 18, wherein a same number of second metal plates as the number of mushroom type structures correspond to an arrangement of the plurality of mushroom type structures and are formed on a same planar surface as the first metal layer.

21. The printed circuit board of claim 11, wherein the metal line has a spiral structure that is wound around the second metal plate.

22. The printed circuit board of claim 11, wherein an electromagnetic wave of a certain frequency range is prevented from being transferred, by using an inductance that is serially connected between the first metal plate and the second metal plate corresponding to the via.

* * * * *